(12) United States Patent
Mitoma

(10) Patent No.: US 7,106,645 B2
(45) Date of Patent: Sep. 12, 2006

(54) SEMICONDUCTOR MEMORY DEVICE HAVING A WORD LINE DRIVE CIRCUIT AND A DUMMY WORD LINE DRIVE CIRCUIT

(75) Inventor: Tetsuya Mitoma, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 592 days.

(21) Appl. No.: 10/626,709

(22) Filed: Jul. 25, 2003

(65) Prior Publication Data

US 2004/0150005 A1    Aug. 5, 2004

(30) Foreign Application Priority Data

Sep. 3, 2002    (JP)    .............................. 2002/257571

(51) Int. Cl.
   *G11C 7/00*    (2006.01)
(52) U.S. Cl. .................. 365/210; 365/203; 365/230.06
(58) Field of Classification Search ................ 365/203, 365/210, 230.06
   See application file for complete search history.

(56) References Cited

U.S. PATENT DOCUMENTS 5,815,451 A * 9/1998 Tsuchida .................... 365/203
6,297,999 B1 * 10/2001 Kato et al. .................. 365/201
6,525,979 B1 * 2/2003 Kato .......................... 365/210
6,549,449 B1 * 4/2003 Takashima .................. 365/149

FOREIGN PATENT DOCUMENTS

JP    60-242591    12/1985
JP    6-187781    7/1994

\* cited by examiner

*Primary Examiner*—Son T. Dinh
(74) *Attorney, Agent, or Firm*—Rabin & Berdo, P.C.

(57) ABSTRACT

A semiconductor integrated circuit device includes bit lines, a word line, a dummy word line, a memory cell, a dummy cell, a dummy word line drive circuit and a word line drive circuit. A dummy word line drive circuit is connected to the dummy word line. The dummy word line drive circuit supplies a precharge potential level that is higher than a first power supply potential level and a second power supply potential level that is lower than the first power supply potential level to the dummy word line. The word line drive circuit is connected to the word line. The word line drive circuit supplies the second power supply potential level and the precharge potential level to the word line.

16 Claims, 9 Drawing Sheets

SEMICONDUCTOR MEMORY DEVICE HAVING A WORD LINE DRIVE CIRCUIT AND A DUMMY WORD LINE DRIVE CIRCUIT

BACKGROUND OF THE INVENTION

The present invention relates to a semiconductor integrated circuit device including a dynamic random access memory (hereafter, it is called DRAM), and to a dummy word line drive system of the DRAM, for example.

Traditionally, as techniques related to memories, there are those described in documents such as JP-A-60-242591 or JP-A-6-187781. FIG. 9 is a schematic circuit diagram illustrating an exemplary configuration of a memory cell part in a DRAM described in JP-A-6-187781 (hereafter, it is simply called Document 2). The memory cell part was proposed for solving disadvantages of the memory cell part described in JP-A-60-242591 (hereafter, it is simply called Document 1), in which complementary first and second bit lines BLa and BLb, a plurality of word lines WL0 and WL1 intersecting each of the bit lines BLa and BLb, a plurality of first dummy word lines DWL0 and DWL1 intersecting the bit lines BLa and BLb, and a plurality of second dummy word lines DWL2 and DWL3 arranged close to the first dummy word lines DWL0 and DWL1 nearly in parallel therewith are provided.

A dynamic memory cell $10_0$ is connected at the intersection of the bit line BLb and the word line WL0, and a dynamic memory cell $10_1$ is connected at the intersection of the bit line BLa and the word line WL1. Each of the memory cells $10_0$ and $10_1$ has a charge storage capacitor 11 and a charge transfer N-channel MOS transistor (hereafter, it is called NMOS) 12. They are serially connected between $\frac{1}{2}$·VCC and the bit lines BLb and BLa (where VCC is power supply voltage).

Dummy cells $20_0$ and $20_1$ are connected at the intersections of the bit lines BLb and BLa and the dummy word lines DWL0 and DWL1, respectively, and dummy cells $20_2$ and $20_3$ are connected at the intersections of the bit lines BLa and BLb and the dummy word lines DWL2 and DWL3, respectively. Each of the dummy cells $20_0$ to $20_3$ is configured of an NMOS.

An equalizer circuit 30 for equalizing the bit lines BLa and BLb to $\frac{1}{2}$·VCC is connected to one ends of the bit lines BLa and BLb. The equalizer circuit 30 is configured of an NMOS 31 connected between the bit line BLa and $\frac{1}{2}$·VCC, an NMOS 32 connected between the bit line BLb and $\frac{1}{2}$·VCC, and an NMOS 33 connected between the bit lines BLa and BLb, and the NMOSs are turned on/off by an equalizer signal EQ.

To the other ends of the bit lines BLa and BLb, a sense amplifier 40 for sensing and amplifying potential difference between the bit lines BLa and BLb is connected, and complementary data lines Da and Db are connected through data transfer NMOSs 51 and 52 to be turned on/off by a column line Y-DEC. The sense amplifier 40 is configured of NMOSs 41 and 42 and P-channel MOS transistors (hereafter, called PMOS) 43 and 44, which are cross connected between the bit lines BLa and BLb in which the NMOSs 41 and 42 are turned on/off by an activating signal φa and the PMOSs 43 and 44 are turned on/off by an activating signal φb in the opposite phase of the activating signal φa.

In the memory cell part of Document 1, the second dummy word lines DWL2 and DWL3 and the dummy cells $20_2$ and $20_3$ are omitted. In such the memory cell part, the readout operation of information 0 stored in the memory cell $10_0$, for example, will be described.

When the equalizer signal EQ is at the VCC level, the bit lines BLa and BLb are equalized to $\frac{1}{2}$·VCC because the NMOSs 31, 32 and 33 in the equalizer circuit 30 are in the ON state. In addition, the sense amplifier activating signals φa and φb are also equalized to $\frac{1}{2}$·VCC. When the equalizer signal EQ falls from the VCC level to a ground voltage (hereafter, it is called GND) level, the NMOSs 31 to 33 in the equalizer circuit 30 are turned to the OFF state. Then, the word line WL0 selected by a decoder, not shown, rises to turn on the NMOS 12 in the memory cell $10_0$, and information 0 stored in the capacitor 11 is outputted to the bit line BLb. At this time, the word line WL0 rises from the GND level to a (VCC+Vt+α) level (where Vt is the threshold voltage of the NMOS), and the dummy word line DWL0 falls from the VCC level to the GND level. The dummy word line DWL1 remains at the VCC level.

Subsequently, the sense amplifier activating signal φa gradually rises from the $\frac{1}{2}$·VCC level to the VCC level, and the sense amplifier activating signal φb falls from the $\frac{1}{2}$·VCC level to the GND level. Then, the sense amplifier 40 operates to amplify the bit line BLa to the VCC level and the bit line BLb to the GND level. After that, the column line Y-DEC rises from the GND level to the VCC level, the data transfer NMOSs 51 and 52 are turned to the ON state, and information of the bit lines BLa and BLb is transferred to the data lines Da and Db.

By disposing the dummy cells $20_0$ and $20_1$, which are originally unnecessary, the memory cell part of the half precharge system described in Document 1 has advantages that can avoid unbalance in the bit line to potential caused by combined voltage of the word lines WL0 and WL1 with the bit lines BLa and BLb and that can increase operational margins to prevent malfunctions.

However, when the word line WL0 is changed from the GND level to the (VCC+Vt+α) level and the dummy word line DWL0 is changed from the VCC level to the GND level in information readout from the memory cell $10_0$, the capacitive coupling of gate capacitances between the word line WL0 and the bit line BLb and between the dummy word line DWL0 and the bit line BLb generates the offset voltage ΔVs between the bit lines BLa and BLb because of the presence of the difference in voltage amplitude ΔV=Vt+α. On this account, there is a disadvantage that a loss is generated in the amount of a readout signal to cause the sense amplifier 40 to malfunction.

Furthermore, when voltage is turned to VCC=1.5 V in a DRAM using voltage level lower than VCC=3.3 V used for a 16-Mbit DRAM, there is a disadvantage that a loss is further increased in the amount of the readout signal because a rate of (Vt+α) occupied in the activation level of the word lines WL0 and WL1 is further up.

Then, in order to solve the disadvantages, a plurality of second dummy word lines DWL2 and DWL3 and a plurality of dummy cells $20_2$ and $20_3$ are disposed near a plurality of first dummy word lines DWL0 and DWL1 in the memory cell part of Document 2.

In the memory cell part of Document 2, when information 0 stored in the memory cell $10_0$ is read out where the boost levels of the word lines WL0 and WL1 are (VCC+Vt+α), for example, the word line WL0 is changed from the GND level to the (VCC+vt+α) level. At this time, the first dummy word line DWL0 is changed from the VCC level to the GND level, and the second dummy word line DWL2 is changed from the VCC level to the (VCC+Vt+α) level. Therefore, the offset voltage ΔVs generated between the bit lines BLa and BLb is cancelled to be zero. Accordingly, the amount of the signal transmitted from the memory cell $10_0$ to the bit line BLb is not varied, and correct information can be read out. In addition to this, since the offset voltage ΔVs generated between the bit lines BLa and BLb is zero, a loss is not generated in the amount of the readout signal and correct information can be read out even in the case of a DRAM using low voltage VCC=1.5 V, for example.

However, although the semiconductor integrated circuit device described in Document 2 can solve the disadvantages of the semiconductor integrated circuit device in Document 1, it needs to be added with the plurality of the second dummy word lines DWL2 and DWL3 and the plurality of the dummy cells $20_2$ and $20_3$. Thus, drive circuits for driving the added dummy word lines DWL2 and DWL3 need to be disposed, and then the number of the circuit elements is increased. Furthermore, since the second the dummy word lines DWL2 and DWL3 are disposed over some of the array configurations, the area for forming the dummy word lines is increased. On this account, there are problems that the chip size is scaled up and the amount of power consumption is increased because the dummy word lines DWL2 and DWL3 are driven, and the problems are difficult to solve.

SUMMARY OF THE INVENTION

An object of the invention may provide a semiconductor integrated circuit device allowing reductions in chip size and in power consumption.

In a semiconductor integrated circuit device including complementary first and second bit lines, a dummy word line intersecting the first and second bit lines, a memory cell being connected to an intersection of the first or second bit line and the word line, and a dummy cell being connected to an intersection of the first or second bit line and the dummy word line, the semiconductor integrated circuit device is configured as below in the invention in a first aspect.

More specifically, in the invention, the dummy word line is changed from a precharge level (the VPP (=VCC+vt+α) level, for example, where Vt is the threshold voltage of an NMOS) higher than a first power supply potential level to a second power supply potential level lower than the first power supply potential level, and the word line is changed from the second power supply potential level to an activation level (the VPP level, for example) as the precharge level in data readout from the memory cell.

BRIEF DESCRIPTION OF THE DRAWINGS

The teachings of the invention can be readily understood by considering the following detailed description in conjunction with the accompanying drawings, in which.

DESCRIPTION OF the PREFERRED EMBODIMENT

First Embodiment

1. Configurations

Figure 1:
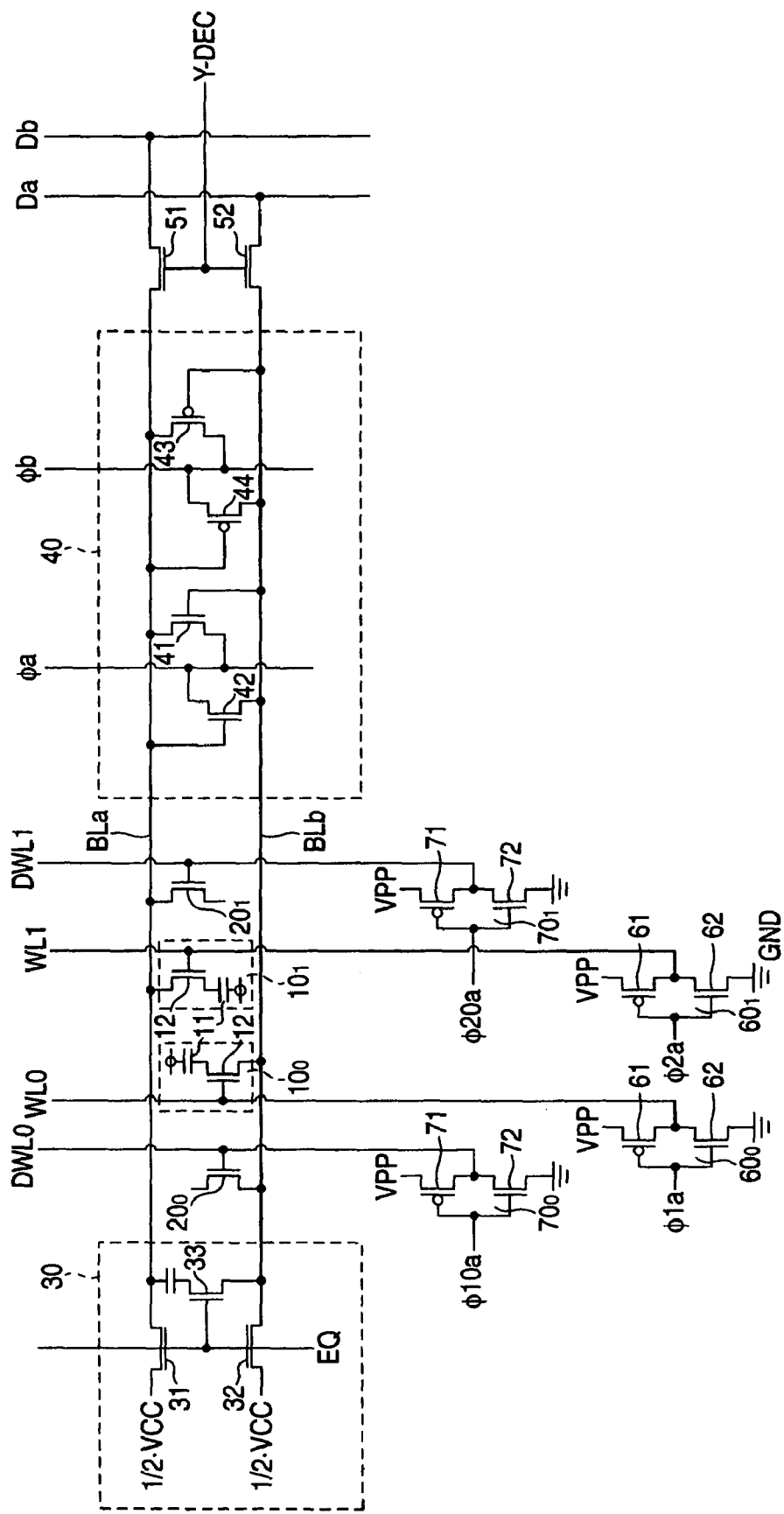
FIG. 1 is a schematic circuit diagram of a memory cell part in a DRAM illustrating a first embodiment according to the invention.

FIG. 1 is a schematic circuit diagram of a memory cell part in a DRAM illustrating a first embodiment according to the invention. The same components as those shown in the traditional memory cell part of FIG. 9 are designated the same numerals and signs.

Figure 9:
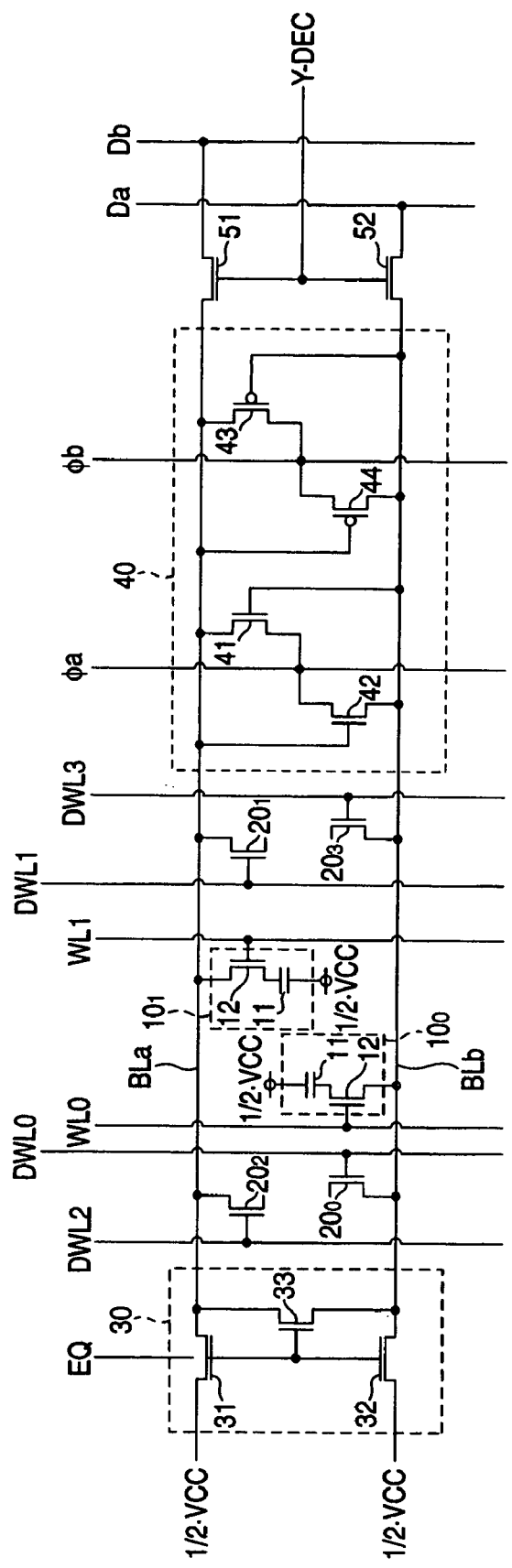
FIG. 9 is a schematic circuit diagram of the memory cell part in the traditional DRAM.

In the memory cell part, the circuit configurations are that the plurality of the dummy word lines DWL2 and DWL3 and the plurality of the dummy cells $20_2$ and $20_3$ shown in the traditional memory cell part of FIG. 9 are omitted.

More specifically, memory cells $10_0$ and $10_1$ are connected to the intersections of first and second bit lines BLa and BLb and a plurality of word lines WL0 and WL1, respectively. In the memory cell $10_0$, a charge storage capacitor 11 and a charge transfer NMOS 12 are serially connected between ½·VCC and the bit line BLb, and a gate of the NMOS 12 is connected to the word line WL0. Also in the memory cell $10_1$, a charge storage capacitor 11 and a charge transfer NMOS 12 are serially connected between ½·VCC and the bit line BLa, and a gate of the NMOS 12 is connected to the word line WL1. An equalizer circuit 30 formed of NMOSs 31, 32 and 33 is connected to one ends of the first and second bit lines BLa and BLb. To the other ends of the bit lines BLa and BLb, a sense amplifier 40 formed of NMOSs 41 and 42 and PMOSs 43 and 44 is connected, and complementary data lines Da and Db are connected through data transfer NMOSs 51 and 52.

To one ends of the word lines WL0 and WL1, word line drive circuits $60_0$ and $60_1$ for driving the word lines are connected, respectively. Each of the word line drive circuits $60_0$ and $60_1$ is a circuit that causes each of the word lines WL0 and WL1 to be changed from a second power supply potential level as a precharge level (the GND level, for example) to a word line activation level (the VPP (=VCC+Vt+α) level, for example, where Vt is the threshold voltage of the NMOS) by word line activating signals φ1a and φ2a given from a decoder, being configured of an inverter formed of a PMOS 61 and an NMOS 62.

In the PMOS 61 of each of the word line drive circuits $60_0$ and $60_1$, a source thereof is connected to VPP, a drain thereof is connected to the word line WL0 or WL1 and a drain of the NMOS 62, and a source of the NMOS 62 is connected to GND. The activating signal φ1a is inputted to gates of the PMOS 61 and the NMOS 62 in the word line drive circuit $60_0$. The activating signal φ2a is inputted to gates of the PMOS 61 and the NMOS 62 in the word line drive circuit $60_1$.

To one ends of the dummy word lines DWL0 and DWL1, dummy word line drive circuits $70_0$ and $70_1$ are connected, respectively. Each of the dummy word line drive circuits $70_0$ and $70_1$ is a circuit that causes the dummy word lines DWL0 and DWL1 to be changed from a precharge level (the VPP level, for example) higher than a first power supply potential level (the VCC level, for example) to a second power supply potential level (the GND level, for example) lower than the VCC level by dummy word line activating signals φ10a and φ20a given from control circuits, being configured of an inverter formed of a PMOS 71 and an NMOS 72.

In the PMOS 71 of the dummy word line drive circuit $70_0$, a source thereof is connected to VPP, a drain thereof is connected to the dummy word line DWL0 and a drain of the NMOS 72, and a source of the NMOS 72 is connected to GND. The activating signal φ10a is inputted to gates of the PMOS 71 and the NMOS 72 in the dummy word line drive circuit $70_0$. In the PMOS 71 of the dummy word line drive circuit $70_1$, a source thereof is connected to VPP, a drain thereof is connected to the dummy word line DWL1 and a drain of the NMOS 72, and a source of the NMOS 72 is connected to GND. The activating signal φ20a is inputted to gates of the PMOS 71 and the NMOS 72 in the dummy word line drive circuit $70_1$.

The other configurations are the same as those shown in FIG. 9.

2. Operation

Figure 2:
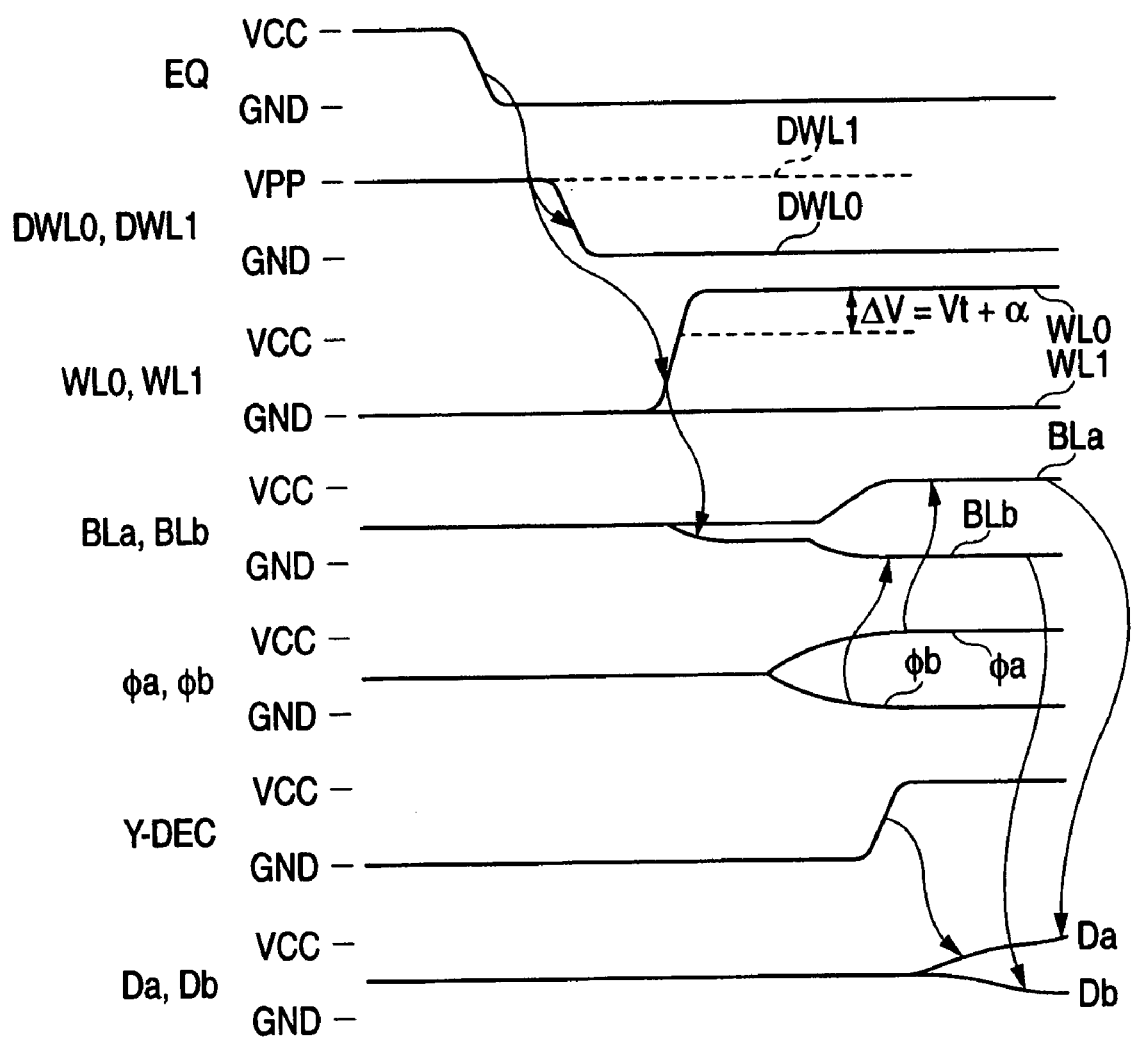
FIG. 2 is a timing chart of the readout operation of the memory cell part shown in FIG. 1.

FIG. 2 is a timing chart illustrating the readout operation of information 0 stored in the memory cell $10_0$ where the boost levels of the word lines WL0 and WL1 shown in FIG. 1 are at the VPP (=VCC+Vt+α) level.

Hereafter, the readout operation of the memory cell part shown in FIG. 1 will be described with reference to FIG. 2.

When the equalizer signal EQ is at the VCC level, the bit lines BLa and BLb are equalized to ½·VCC because the NMOSs 31, 32 and 33 in the equalizer circuit 30 are in the ON state. In addition, since the sense amplifier activating signals φa and φb are also equalized to ½·VCC, the NMOSs 41 and 42 and the PMOSs 43 and 44 in the sense amplifier 40 are in the OFF state. When the equalizer signal EQ is changed from the VCC level to the GND level, the NMOSs 31, 32 and 33 in the equalizer circuit 30 are turned to the OFF state.

Subsequently, the dummy word line activating signal φ10a given from a control circuit, not shown, rises to high level, the PMOS 71 in the dummy word line drive circuit $70_0$ is turned to the OFF state, and the NMOS 72 is turned to the ON state. Therefore, the dummy word line DWL0 is changed from the VPP level to the GND level. After the dummy word line DWL0 is turned to the GND level, the word line activating signal φ1a given from a decoder, not shown, falls to low level, the PMOS 61 in the word line drive circuit $60_0$ is turned to the ON state, and the NMOS 62 is turned to the OFF state. When the PMOS 61 is in the ON state, the word line WL0 is changed from the GND level to the VPP level, the NMOS 12 in the memory cell $10_0$ is turned to the ON state, and information 0 stored in the memory cell $10_0$ is outputted to the bit line BLb.

When the dummy word line DWL0 is changed from the VPP level to the GND level and the word line WL0 is changed from the GND level to the VPP level, the difference in voltage amplitude ΔV between the dummy word line DWL0 and the word line WL0 is zero. Thus, the capacitive coupling of gate capacitances between the word line WL0 and the bit line BLb and between the dummy word line DWL0 and the bit line BLb causes the offset voltage ΔVs of the bit line BLb to be zero. On this account, the amount of the signal transmitted from the memory cell $10_0$ to the bit line BLb is not varied.

Therefore, the potential difference between the bit lines BLa and BLb is increased properly until the sense amplifier 40 operates. After that, the sense amplifier activating signal φa rises from the ½·VCC level to the VCC level, the sense amplifier activating signal φb falls from the ½·VCC level to the GND level, and the sense amplifier 40 operates to amplify the potential difference between the bit lines BLa and BLb.

Then, the column line Y-DEC rises from the GND level to the VCC level, the data transfer NMOSs 51 and 52 are turned to the ON state, and readout information 0 on the bit lines BLa and BLb is correctly read out to the data lines Da and Db.

Correspondingly, in the write operation of the memory cell part shown in FIG. 1 (for example, the write operation of information into the memory cell $10_0$), the dummy word lines DWL0 and DWL1 are not driven. Write information is inputted to the data lines Da and Db, the equalizer circuit 30 is turned to the OFF state, the sense amplifier 40 is turned to the ON state, and then the NMOSs 51 and 52 are turned to the ON state. Subsequently, the write information on the data lines Da and Db is transferred to the bit lines BLa and BLb. The write information on the bit lines BLa and BLb is amplified by the sense amplifier 40, and then it is written in the memory cell $10_0$ through the NMOS 12 into the memory cell $10_0$, the NMOS 12 is in the ON state by activating the word line WL0.

3. Advantages

The first embodiment has advantages (a) to (c) below.

(a) After the dummy word line DWL0 is changed from the VPP level to the GND level, the word line WL0 is changed from the GND level to the VPP level, and then information 0 stored in the memory cell $10_0$ is read out. Therefore, the difference in voltage amplitude ΔV between the dummy word line DW0 and the word line WL0 is zero, and the offset voltage ΔVs of the bit line BLb is zero by the capacitive coupling of gate capacitances between the word line WL0 and the bit line BLb and between the dummy word line DW0 and the bit line BLb. Accordingly, the amount of the signal transmitted from the memory cell $10_0$ to the bit line BLb is not varied, and correct information can be read out. In addition to this, since the offset voltage ΔVs generated between the bit lines BLa and BLb is zero, a loss is not generated in the amount of the readout signal and correct information can be read out even in the case of a DRAM using low voltage (VCC=1.5 V, for example).

(b) Since the plurality of the dummy word lines DWL2 and DWL3 and the plurality of the dummy cells $20_2$ and $20_3$ in the traditional memory cell part shown in FIG. 9 are unnecessary, the area for forming the dummy word lines can be reduces, and the number of the circuit elements can be decreased. Accordingly, the chip size can be scaled down, and the amount of power consumption can be reduced.

(c) Since the dummy word line drive circuits $70_0$ and $70_1$ are configured of the inverter formed of the PMOS 71 and the NMOS 72, the circuit configurations are simple, the area for forming the circuit is small, and the chip size can be further scaled down.

Second Embodiment

1. Configurations

Figure 3:
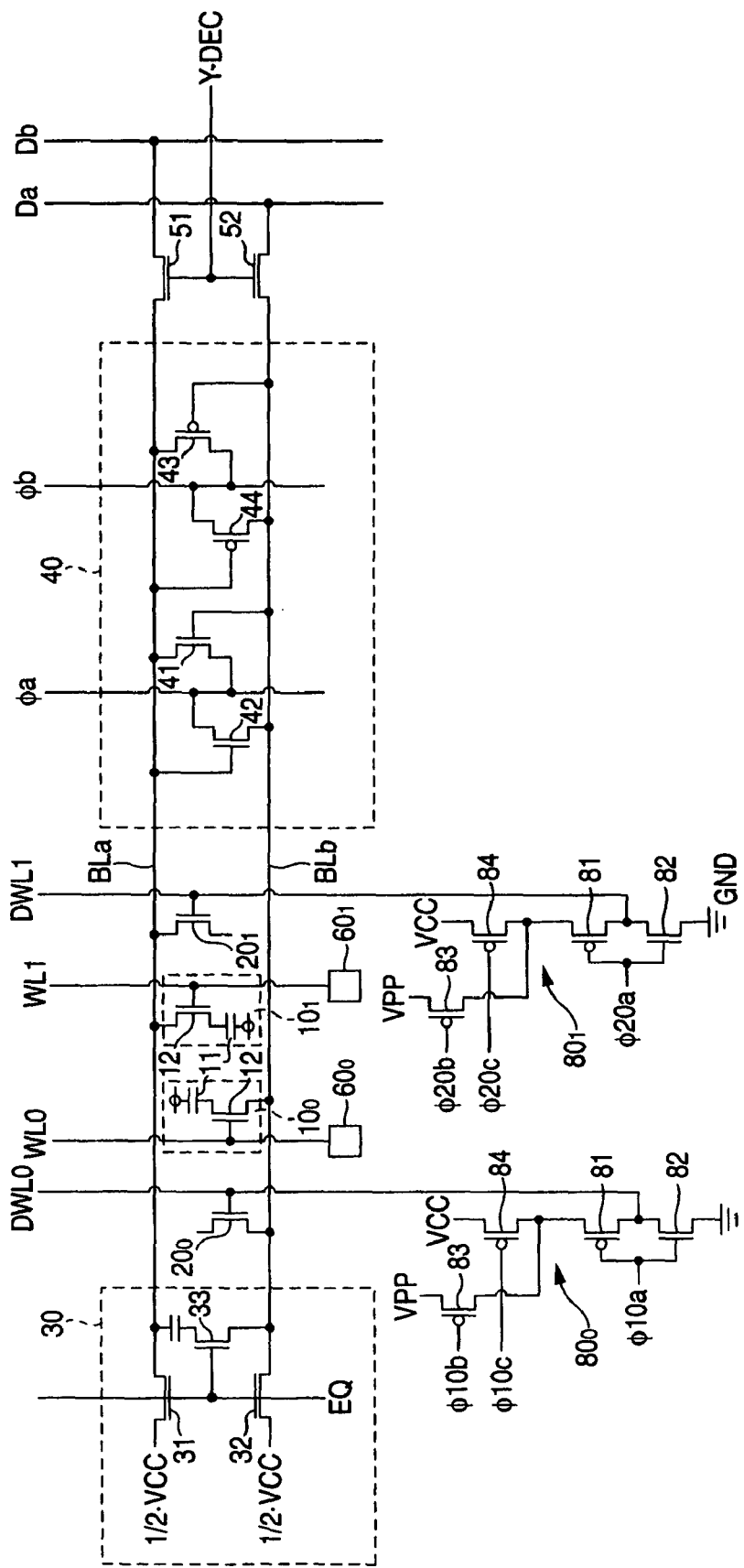
FIG. 3 is a schematic circuit diagram of a memory cell part in a DRAM illustrating a second embodiment according to the invention.

FIG. 3 is a schematic circuit diagram of a memory cell part in a DRAM illustrating a second embodiment according to the invention. The same components as those shown in FIG. 1 illustrating the first embodiment are designated the same numerals and signs.

The memory cell part has only one point different from the first embodiment in that a plurality of dummy word line drive circuits $80_0$ and $80_1$ having different configurations is disposed instead of the plurality of the dummy word line drive circuits $70_0$ and $70_1$ shown in FIG. 1. As similar to FIG.

1, a word line (first word line) WL0 is driven by a word line drive circuit $60_0$, and a word line (second word line) WL1 is driven by a word line drive circuit $60_1$.

The dummy word line drive circuit $80_0$ for driving a dummy word line (first dummy word line) DWL0 has an inverter formed of a PMOS 81 and an NMOS 82 to be inputted with a dummy word line activating signal φ10a given from a control circuit in which an output of the inverter is connected to the dummy word line DWL0. A drain of the PMOS 81 is connected to the dummy word line DWL0 and a drain of the NMOS 82, and a source of the NMOS 82 is connected to GND. The activating signal φ10a is inputted to gates of the PMOS 81 and the NMOS 82.

PMOSs 83 and 84 for switching and applying VPP and VCC are connected to a source of the PMOS 81. In the PMOS 83, a source thereof is connected to VPP, a drain thereof is connected to the source of the PMOS 81, and a gate thereof is inputted with an activating signal φ10b. In the PMOS 84, a source thereof is connected to VCC, a drain thereof is connected to the source of the PMOS 81, and a gate thereof is inputted with an activating signal φ10c.

The dummy word line drive circuit $80_1$ for driving a dummy word line (second dummy word line) DWL1 is configured of an inverter formed of a PMOS 81 and an NMOS 82, and PMOSs 83 and 84 for switching and applying VPP and VCC, as similar to the dummy word line drive circuit $80_0$.

The dummy word line drive circuit $80_1$ is the same circuit as the dummy word line drive circuit $80_0$, but only dummy word line activating signals φ20a, φ20b and φ20c are different from the dummy word line drive circuit $80_0$. More specifically, the activating signal φ20a is inputted to gates of the PMOS 81 and the NMOS 82, and the activating signals φ20b and φ20c are inputted to gates of the PMOSs 83 and 84.

The other configurations are the same as those shown in FIG. 1.

2. Operation

Figure 4A:
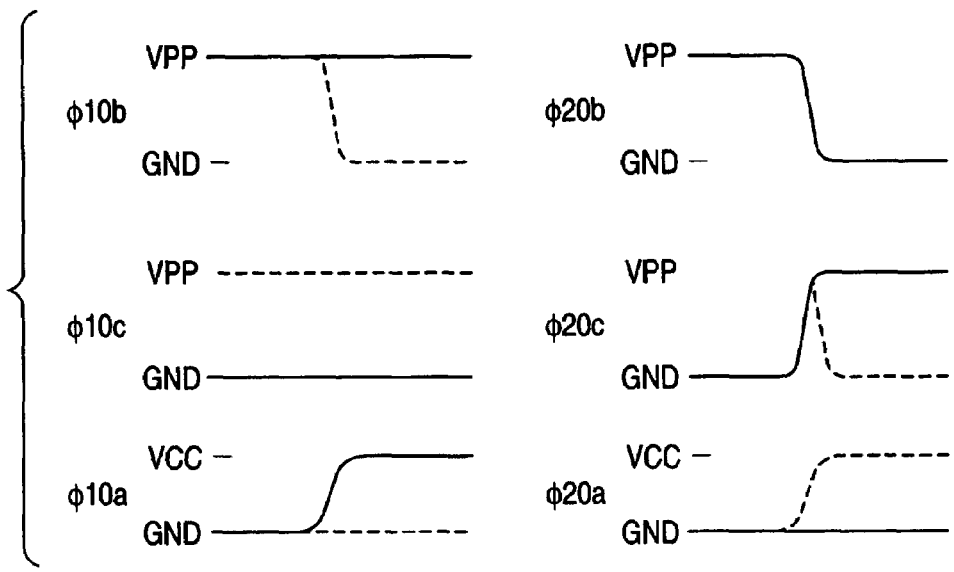
FIGS. 4A and 4B are timing charts of the readout operation of the memory cell part shown in FIG. 3.
Figure 4B:
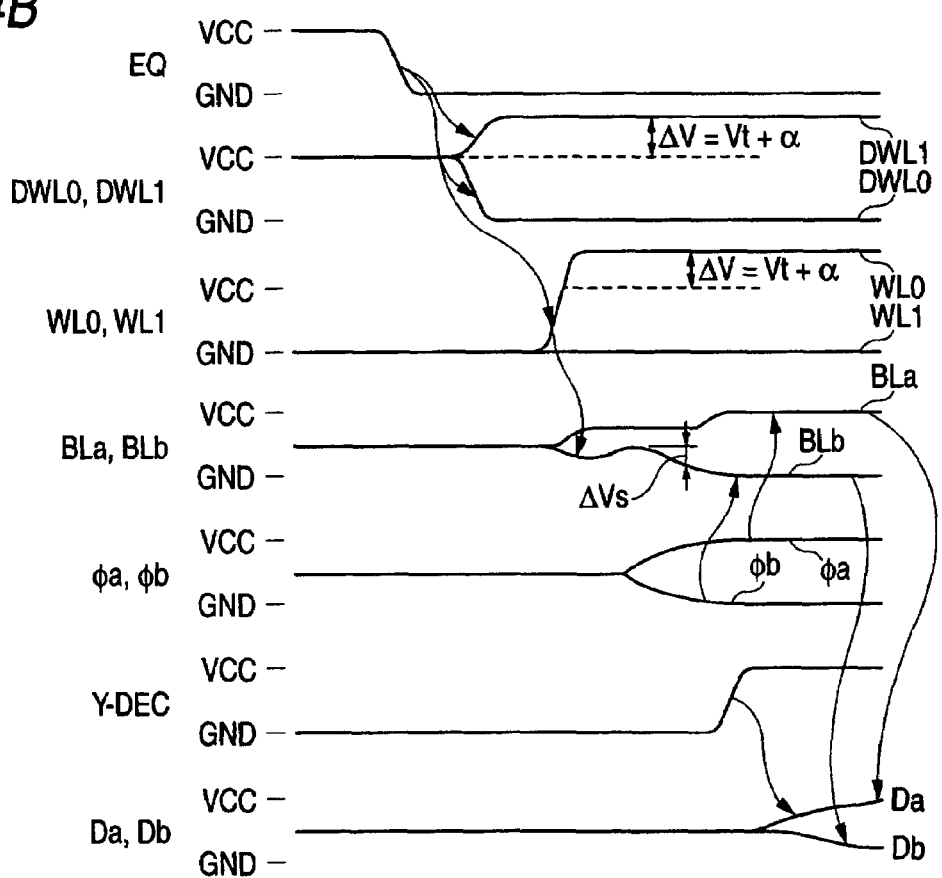

FIGS. 4A and 4B are timing charts of the readout operation of information 0 stored in a memory cell (first memory cell) $10_0$ where the boost levels of the word lines WL0 and WL1 shown in FIG. 3 are at the VPP (=VCC+Vt+α) level.

Hereafter, the readout operation of the memory part shown in FIG. 3 will be described with reference to FIGS. 4A and 4B.

As similar to FIG. 1, when an equalizer signal EQ is at the VCC level, the bit lines BLa and BLb are equalized to ½·VCC by an equalizer circuit 30 and sense amplifier activating signals φa and φb are also equalized to ½·VCC. Thus, a sense amplifier 40 is in the OFF state.

At this time, the word lines WL0 and WL1 are at the GND level. In addition, among the dummy word line activating signals φ10a to φ10c, and φ20a to φ20c, the signal φ10a is at the GND level, the signal φ10b is at the VPP level, the signal φ10c is at the GND level, the signal φ20a is at the GND level, the signal φ20b is at the VPP level, and the signal φ20c is at the GND level. On this account, since the PMOSs 81 and 84 are in the ON state and the NMOS 82 and the PMOS 83 are in the OFF state in each of the dummy word line drive circuits $80_0$ and $80_1$, the word lines DWL0 and DWL1 are precharged at the VCC level.

When the equalizer signal EQ is changed from the VCC level to the GND level, the equalizer circuit 30 is turned to the OFF state. Subsequently, among the dummy word line activating signals φ10a to φ10c and φ20a to φ20c, the signal φ10b keeps the VPP level, the signals φ10c and φ20a keep the GND level, the signal φ10a changes to the VCC level, the signal 20b changes to the GND level, and the signal φ20c changes to the VPP level. On this account, the PMOS 81 is tuned off and the NMOS 82 is turned on in the dummy word line drive circuit $80_0$, and the dummy word line DWL0 is changed from the VCC level to the GND level. Furthermore, since the PMOSs 81 and 83 are turned on and the NMOS 82 and the PMOS 84 are turned off in the dummy word line drive circuit $80_1$, the dummy word line DWL1 is changed from the VCC level to the VPP level.

After that, a word line activating signal given from decoder, not shown, causes the word line WL0 to rise at high level, the NMOS 12 in the memory cell $10_0$ is turned to the ON state, and information 0 stored in the memory cell $10_0$ is outputted to the bit line BLb.

Here, when the dummy word line DWL0 is changed from the VCC level to the GND level and the word line WL0 is changed from the GND level to the VPP level, the word line WL0 and the dummy word line DWL0 have the difference in voltage amplitude Δv=Vt+α. Therefore, the capacitive coupling of gate capacitances between the word line WL0 and the bit line BLb and between the dummy word line DWL0 and the bit line BLb generates the offset voltage ΔVs=Vt+α in the bit line BLb. Moreover, when the dummy word line DWL1 is changed from the VCC level to the VPP level, the word line WL0 and the dummy word line DWL0 have the difference in voltage amplitude ΔV=Vt+α. Thus, the capacitive coupling of gate capacitances between the word line WL0 and the bit line BLb and between the dummy word line DWL0 and the bit line BLb generates the offset voltage ΔVs=Vt+α in the bit line BLb. On this account, the offset voltage ΔVs generated between the bit lines BLb and BLa is cancelled, and the amount of the signal transmitted from the memory cell $10_0$ to the bit line BLb is not varied.

Accordingly, the potential difference between the bit lines BLa and BLb is increased properly until the sense amplifier 40 operates. After that, the sense amplifier activating signal φa rises from the ½·VCC level to the VCC level, the sense amplifier activating signal φb falls from the ½·VCC level to the GND level, and the sense amplifier 40 operates to amplify the potential difference between the bit lines BLa and BLb, as similar to FIG. 1.

Then, the column line Y-DEC rises from the GND level to the VCC level, data transfer NMOSs 51 and 52 are turned to the ON state, and readout information 0 on the bit lines BLa and BLb is correctly read out to data lines Da and Db.

3. Advantages

The second embodiment has advantages (a) to (c) below.

(a) In readout, the dummy word line DWL0 is changed from the VCC level to the GND level and the dummy word line DWL1 is changed from the VCC level to the VPP level, and then the word line WL0 is changed from the GND level to the VPP level. Therefore, the offset voltage ΔVs generated between the bit lines BLa and BLb is cancelled to be zero. Accordingly, the amount of the signal transmitted from the memory cell $10_0$ to the bit line BLb is not varied, and correct information can be read out. In addition, since the offset voltage ΔVs generated between the bit lines BLa and BLb is zero, a loss is not generated in the amount of the readout signal and correct information can be read out even in the case of a DRAM using low voltage (VCC=1.5 V, for example).

(b) The second embodiment has the same advantage as advantage (b) of the first embodiment.

(c) Since the dummy word line drive circuits $80_0$ and $80_1$ have smaller voltage transitions of the dummy word lines DWL0 and DWL1 than those in the first embodiment, the circuits have a fast operating speed and they are not adversely affected by noises. Furthermore, since the drive performance of the dummy word line drive circuits $80_0$ and $80_1$ is fine to be small, the amount of power consumption can be further reduced.

Third Embodiment

1. Configurations

Figure 5:
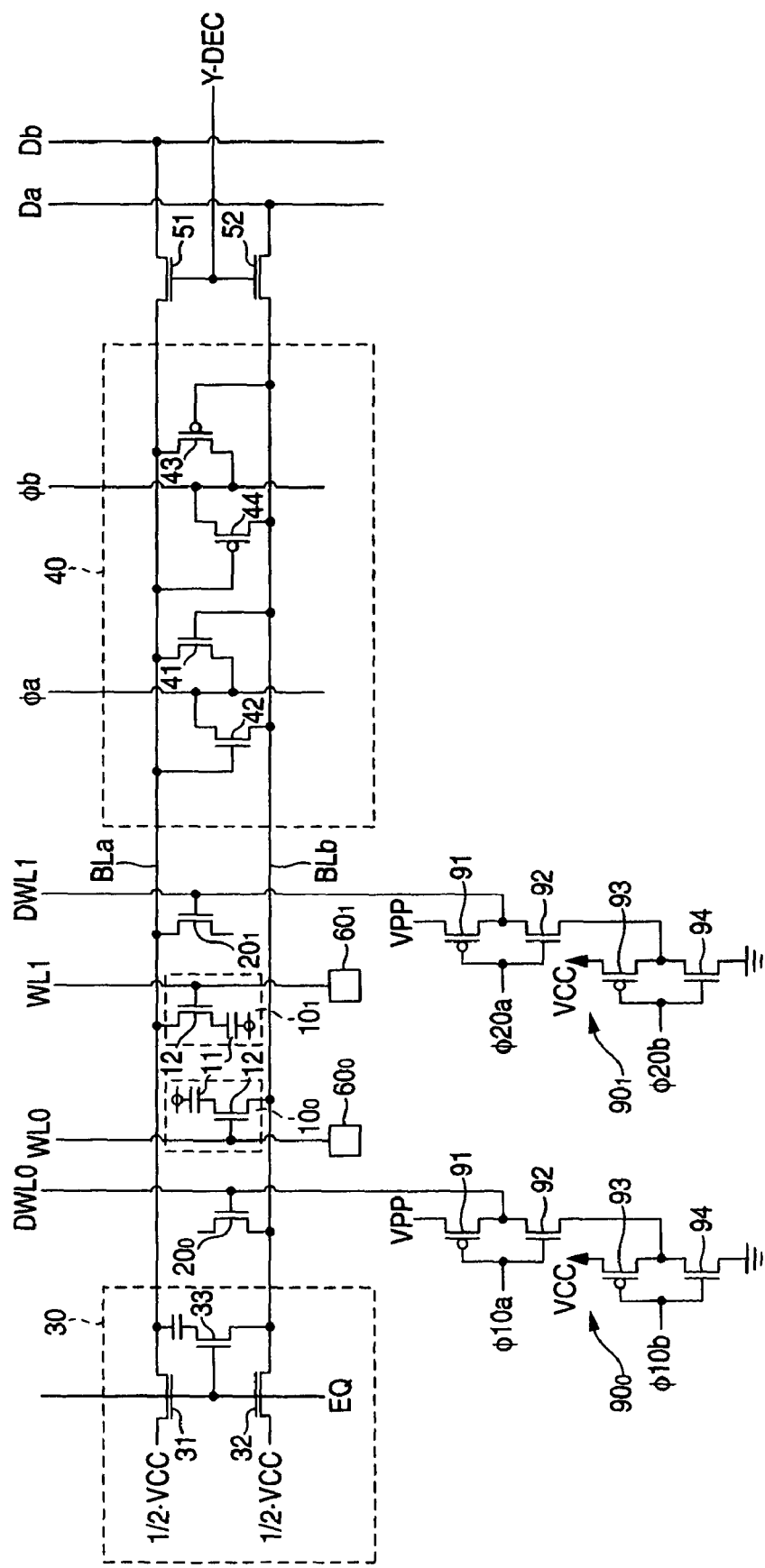
FIG. 5 is a schematic circuit diagram of a memory cell part in a DRAM illustrating a third embodiment according to the invention.

FIG. 5 is a schematic circuit diagram of a memory cell part in a DRAM illustrating a third embodiment according to the invention. The same components as those shown in FIG. 3 depicting the second embodiment are designated the same numerals and signs.

The memory cell part has only one point different from the second embodiment in that a plurality of dummy word line drive circuits $90_0$ and $90_1$ having different configurations is disposed instead of the plurality of the dummy word line drive circuits $80_0$ and $80_1$ shown in FIG. 3.

The dummy word line drive circuit $90_0$ for driving a dummy word line (first dummy word line) DWL0 is configured of an inverter formed of a PMOS 91 and an NMOS 92 to be inputted with a dummy word line activating signal φ10a and an inverter formed of a PMOS 93 and an NMOS 94 for switching between VCC and GND and connecting to a drain of the NMOS 92.

A source of the PMOS 91 is connected to VPP, a drain thereof is connected to the dummy word line DWL0 and a drain of the NMOS 92, and the dummy word line activating signal φ10a is inputted to gates of the PMOS 91 and the NMOS 92. A source of the NMOS 92 is connected to drains of the PMOS 93 and the NMOS 94. A source of the PMOS 93 is connected to VCC, a source of the NMOS 94 is connected to GND, and a dummy word line activating signal φ10b is inputted to gates of the PMOS 93 and the NMOS 94.

The dummy word line drive circuit $90_1$ for driving a dummy word line (second dummy word line) DWL1 is configured of the same circuit as the dummy word line drive circuit $90_0$ in which only dummy word line activating signals φ20a and φ20b to be inputted are varied.

The other configurations are the same as those shown in FIG. 3.

2. Operation

Figure 6:
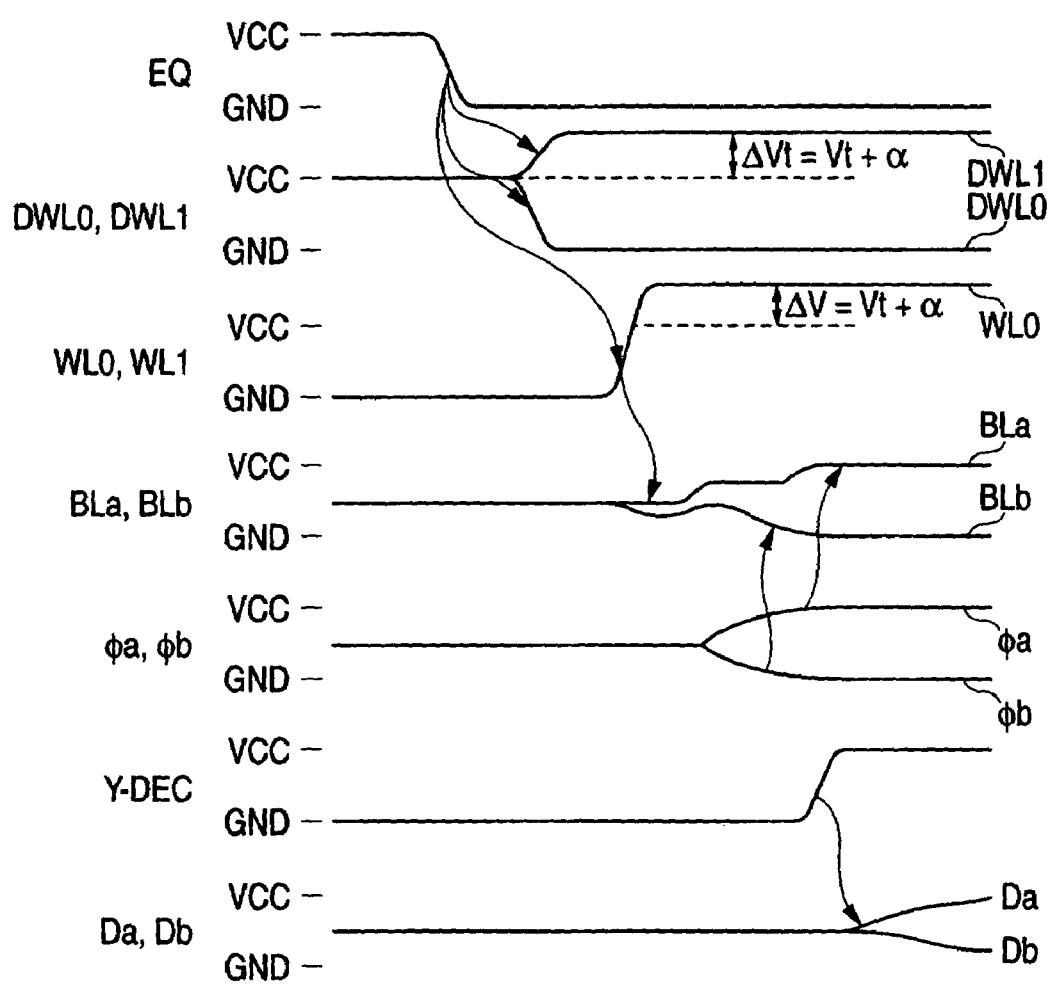
FIG. 6 is a timing chart of the readout operation of the memory cell part shown in FIG. 5.

FIG. 6 is a timing chart of the readout operation of information 0 stored in a memory cell (first memory cell) $10_0$ where the boost levels of the word line (first word line) WL0 and the word line (second word line) wL1 shown in FIG. 5 are at the VPP (=VCC+Vt+α) level.

Hereafter, the readout operation of the memory cell part shown in FIG. 5 will be described with reference to FIG. 6.

As similar to FIG. 3, when an equalizer signal EQ is at the VCC level, bit lines BLa and BLb are equalized to the ½·VCC level and a sense amplifier 40 is also in the OFF state. At this time, since the dummy word line activating signals φ10a and φ20a are at high level, and the dummy word line activating signals φ10b and φ20b are at low level, and the PMOS 91 and NMOS 94 are in the OFF state and the NMOS 92 and PMOS 93 are in the ON state in the dummy word line drive circuits $90_0$ and $90_1$. On this account, the dummy word lines DWL0 and DWL1 are precharged at the VCC level.

After the equalizer signal EQ is changed from the VCC level to the GND level and an equalizer circuit 30 is turned to the OFF state, the dummy word line activating signal φ10b rises from low level to high level, the PMOS 93 is turned to the OFF state, the NMOS 94 is turned to the ON state, and then the dummy word line DWL0 is changed from the VCC level to the GND level. At the same time, the dummy word line activating signal φ20a falls from high level to low level, the PMOS 91 is turned to the ON state and the NMOS 92 is turned to the OFF state in the dummy word line drive circuit $90_1$, and then the dummy word line DWL1 is changed from the VCC level to the VPP level.

Subsequently, the word line WL0 is changed from the GND level to the VPP level, as similar to FIG. 3. When the dummy word line DWL0 is changed from the VCC level to the GND level and the word line WL0 is changed from the GND level to the VPP level, the word line WL0 and the dummy word line DWL0 have the difference in voltage amplitude Δv=Vt+α. Therefore, the offset voltage ΔVs=Vt+α is generated in the bit line BLb by the capacitive coupling of gate capacitances between the word line WL0 and the bit line BLb and between the dummy word line DWL0 and the bit line BLb.

In addition, when the dummy word line DWL1 is changed from the VCC level to the VPP level, the word line WL0 and the dummy word line DWL0 have the difference in voltage amplitude Δv=Vt+α. Therefore, the offset voltage ΔVs=Vt+α is generated in the bit line BLb by the capacitive coupling of gate capacitances between the word line WL0 and the bit line BLb and between the dummy word line DWL0 and the bit line BLb. On this account, the offset voltage ΔVs generated between the bit lines BLb and BLa is cancelled, and the amount of the signal transmitted from the memory cell $10_0$ to the bit line BLb is not varied.

Accordingly, the potential difference between the bit lines BLa and BLb is increased properly until the sense amplifier 40 operates, as similar to FIG. 3. After that, the sense amplifier 40 operates to amplify the potential difference between the bit lines BLa and BLb, and readout information 0 on the bit lines BLa and BLb is correctly read out to data lines Da and Db through NMOSs 51 and 52.

3. Advantages

The third embodiment has advantages (a) to (c) below.

(a) The third embodiment has the same advantage as advantage (a) of the second embodiment.

(b) The third embodiment has the same advantage as advantage (b) of the first embodiment.

(c) As similar to advantage (c) of the second embodiment, since voltage transitions of the dummy word lines DWL0 and DWL1 are small, the dummy word line drive circuits $90_0$ and $90_1$ have a fast operating speed and they are not adversely affected by noises. In addition to this, since the drive performance of the dummy word line drive circuits $90_0$ and $90_1$ is fine to be small and the number of the signals φ10a, φ10b, φ20a, and φ20b is smaller than that in the second embodiment, the amount of power consumption can be further reduced. However, since each of the dummy word line drive circuits $90_0$ and $90_1$ is configured of the inverter formed of the PMOS 91 and the NMOS 92 and the inverter formed of the PMOS 93 and the NMOS 94, the PMOS and the NMOS need to be separated by using a well when they are formed on a semiconductor substrate.

Fourth Embodiment

1. Configurations

Figure 7:
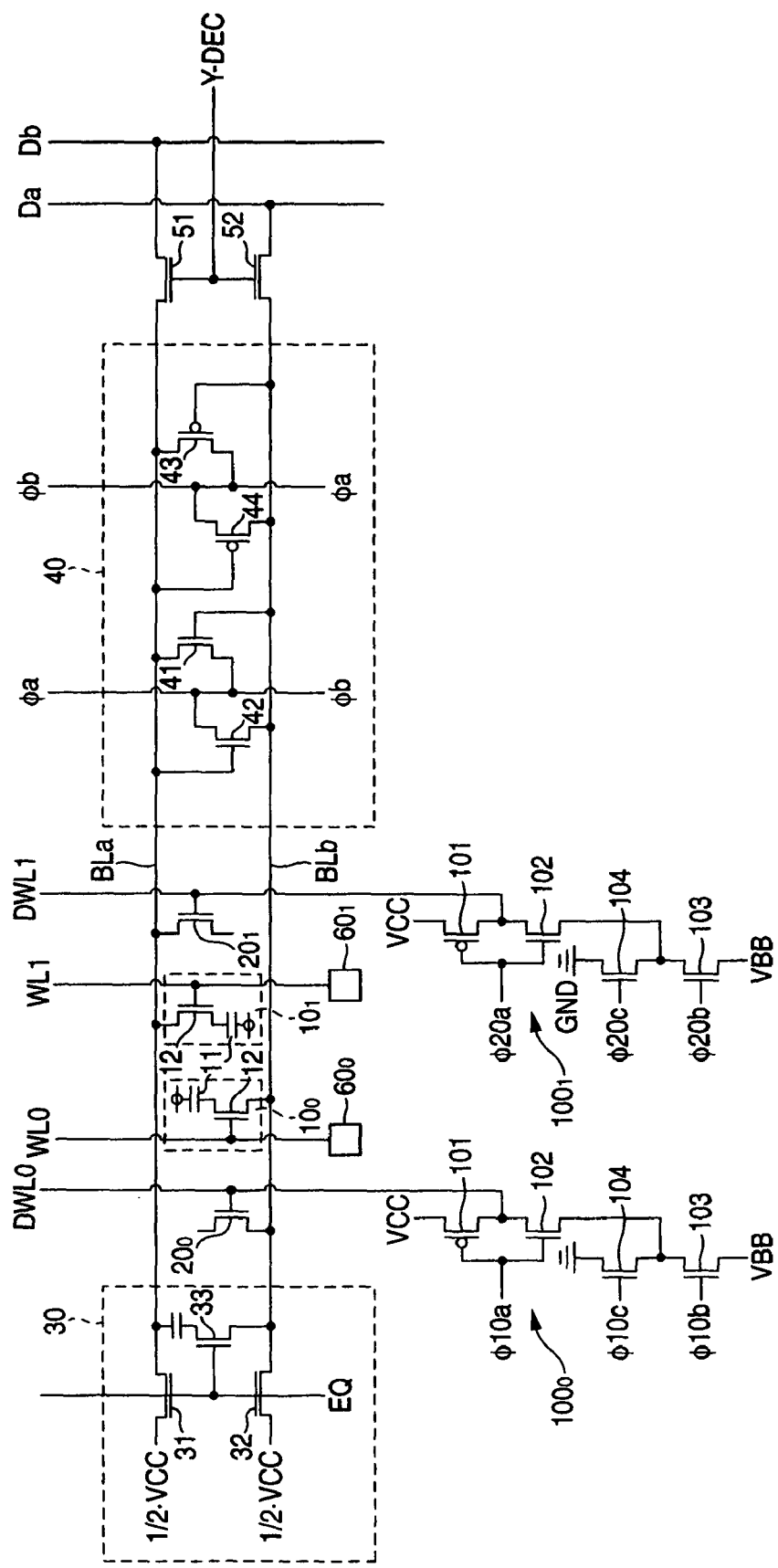
FIG. 7 is a schematic circuit diagram of a memory cell part in a DRAM illustrating a fourth embodiment according to the invention.

FIG. 7 is a schematic circuit diagram of a memory cell part in a DRAM illustrating a fourth embodiment according to the invention. The same components as those shown in FIG. 1 illustrating the first embodiment are designated the same numerals and signs.

In the memory cell part, a plurality of dummy word line drive circuits $100_0$ and $100_1$ having different configurations is disposed instead of the plurality of the dummy word line drive circuits $70_0$ and $70_1$ shown in FIG. 1. The other configurations are the same as those shown in FIG. 1.

The dummy word drive circuit $100_0$ for driving a dummy word line DWL0 is configured of an inverter formed of a PMOS 101 and an NMOS 102 to be inputted with a dummy word line activating signal φ10a, and NMOSs 103 and 104 for switching between GND and a third power supply potential (negative power supply voltage VBB of $-\frac{1}{2}$·VCC, for example) and connecting to a source of the NMOS 102.

A source of the PMOS 101 is connected to VCC, a drain thereof is connected to the dummy word line DWL0 and a drain of the NMOS 102, and the dummy word line activating signal φ10a is inputted to gates of the PMOS 101 and the NMOS 102. The source of the NMOS 102 is connected to a drain of the NMOS 103 and a source of the MMOS 104. A source of the NMOS 103 is connected to VBB, and a drain of the NMOS 104 is connected to GND. A dummy word line activating signal φ10b is inputted to a gate of the NMOS 103, and a dummy word line activating signal φ10c is inputted to a gate of the NMOS 104.

The word line drive circuit $100_1$ for driving a dummy word line DWL1 is configured of the same circuit as the dummy word line drive circuit $100_0$, in which only dummy word line activating signals φ20a, φ20b, and φ20c are varied.

2. Operation

Figure 8A:
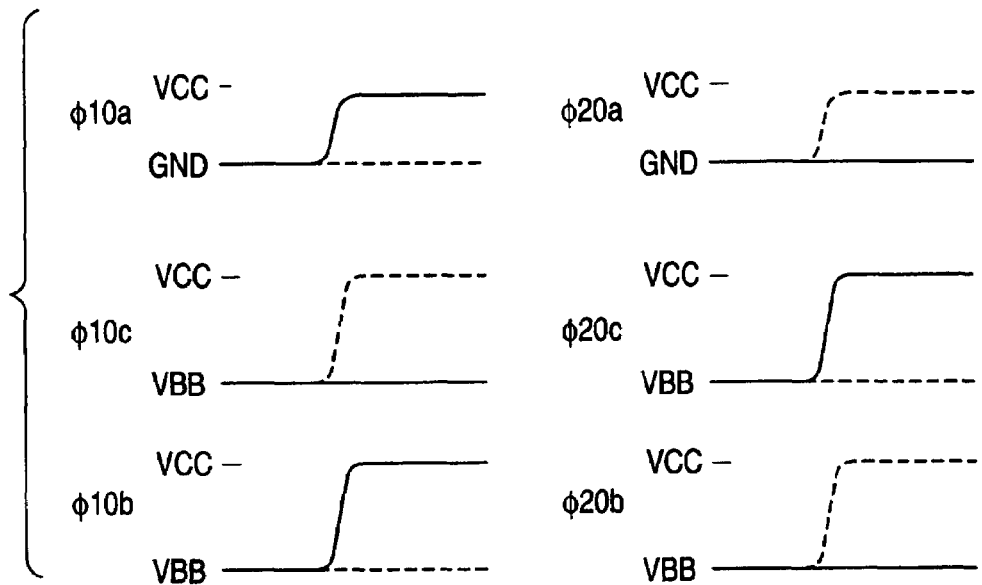
FIGS. 8A and 8B are timing charts of the readout operation of the memory cell part shown in FIG. 7.
Figure 8B:
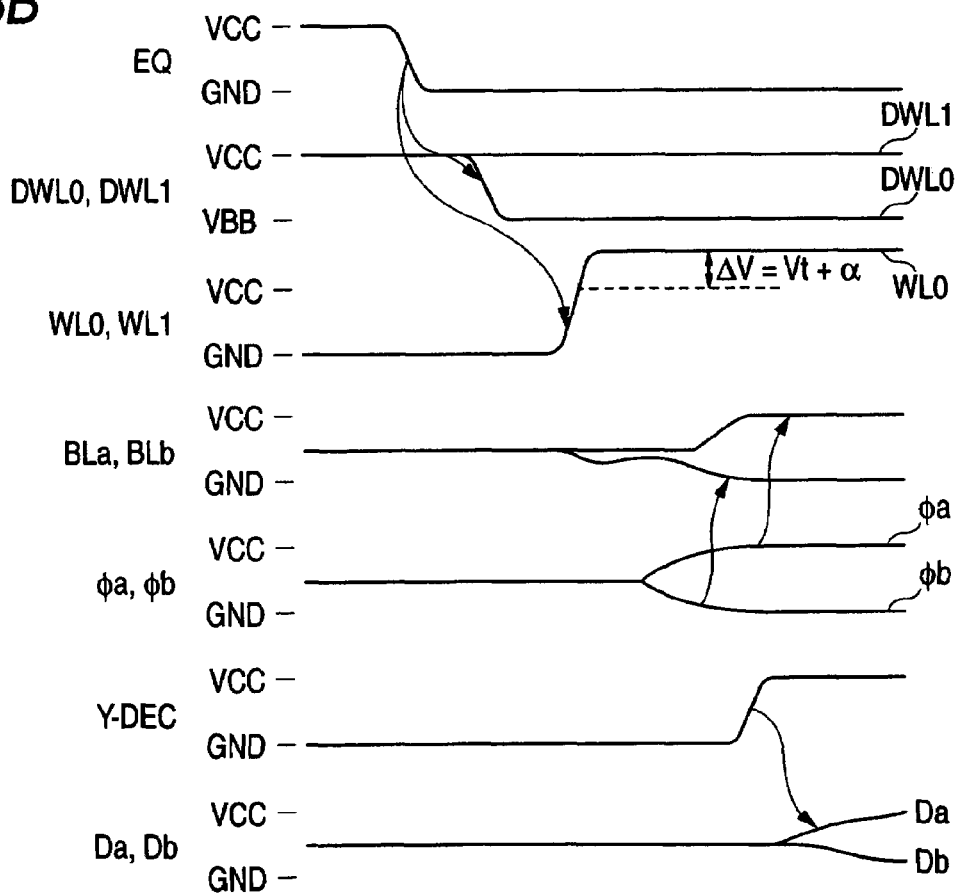

FIGS. 8A and 8B are timing charts of the readout operation of information 0 stored in a memory cell $10_0$ where the boost levels of the word lines WL0 and WL1 shown in FIG. 7 are at the VPP (=VCC+Vt+α) level.

Hereafter, the readout operation of the memory cell part shown in FIG. 7 will be described with reference to FIGS. 8A and 8B.

As similar to FIG. 1, when an equalizer signal EQ is at the VCC level, an equalizer circuit 30 is in the ON state and a sense amplifier 40 is in the OFF state. At this time, since the dummy word line activating signals φ10a to φ10c, and φ20a to φ20c are at low level, the PMOS 101 is in the ON state and the NMOSs 102 to 104 are in the OFF state in each of the dummy word line drive circuits $100_0$ and $100_1$. Therefore, the dummy word lines DWL0 and DWL1 are precharged at the VCC level.

When the equalizer signal EQ is changed from the VCC level to the GND level, the equalizer circuit 30 is turned to the OFF state. Subsequently, the dummy word line activating signals φ10a and φ10b rise from low level to high level, and the dummy word line activating signal φ20c rises from low level to high level. Then, the PMOS 101 is turned to the OFF state and the NMOSs 102 and 103 are turned to the ON state in the dummy word line drive circuit $100_0$, and the dummy word line DWL0 is changed from the VCC level to the VBB level. At this time, since the PMOS 101 keeps the ON state in the dummy the word line drive circuit $100_1$, the dummy word line DWL1 is held at the VCC level.

After that, as similar to FIG. 1, the word line WL0 is changed from the GND level to the VPP level. At this time, since the difference in voltage amplitude ΔV is nearly zero between the word line WL0 and the dummy word line DWL0, the offset voltage ΔVs of the bit line BLb is nearly zero by the capacitive coupling of gate capacitances between the word line WL0 and the bit line BLb and between the dummy word line DWL0 and the bit line BLb. Then, the word line WL0 rises to high level to cause the NMOS 12 in the memory cell $10_0$ to be the ON state, and information 0 stored in the memory cell $10_0$ is outputted to the bit line BLb. Since the offset voltage ΔVs generated in the bit line BLb is nearly zero, the amount of the signal transmitted from the memory cell $10_0$ to the bit line BLb is not varied.

Accordingly, as similar to FIG. 1, the potential difference between the bit lines BLa and BLb is increased until the sense amplifier 40 operates. After that, the sense amplifier 40 amplifies the potential difference between the bit lines BLa and BLb, and then readout information 0 is correctly read out to data lines Da and Db through NMOSs 51 and 52.

3. Advantages

The fourth embodiment has advantages (a) to (c) below.

(a) The fourth embodiment has almost the same advantage as advantage (a) of the first embodiment.

(b) The fourth embodiment has almost the same advantage as advantage (b) of the first embodiment.

(c) The negative power supply voltage VBB is applied to the source of the NMOS 103 in each of the dummy word line drive circuits $100_0$ and $100_1$. When the negative power supply voltage VBB is applied to a semiconductor well forming a capacitor 11 in each of the memory cells $10_0$ and $10_1$, for example, leakage current at the P-N junction in the semiconductor well can be reduced. Therefore, the amount of power consumption in the memory cell part can be further reduced.

MODIFIED EXAMPLE

The invention is not limited to the embodiments, which can be modified variously. As the modified examples, (i) and (ii) below are named.

(i) It is acceptable that the numbers of the bit line BLa and BLb, the word lines WL0 and WL1, and the dummy word lines DWL0 and DWL1 in the memory cell part are set freely, the memory cells $10_0$ and $10_1$ and the dummy cells $20_0$ and $20_1$ are configured of other circuits, or the equalizer circuit 30, the sense amplifier 40 and the data transfer NMOSs 51 and 52 are formed to have other transistor configurations.

(ii) The embodiments can be adapted to other semiconductor integrated circuit devices such as semiconductor memories.

As described above in detail, according to the invention in the first aspect and a fifth aspect, the dummy word line is changed from the precharge level to the second power supply potential level and the word line is also changed from the second power supply potential level to the word line activation level in data readout from the memory cell. Therefore, the offset voltage generated between the first and second bit lines is zero, the amount of the signal transmitted from the memory cell to the bit lines is not varied, and correct information can be read out even in semiconductor integrated circuit devices such as a DRAM using low voltage. In addition, the numbers of the dummy word lines, the dummy cells, and the dummy word line drive circuits can be reduced, thus allowing reductions in the chip size and in the power consumption.

According to the invention in second and third aspects, the first and second dummy word lines are changed from the first power supply potential level as the precharge level to the level higher or lower than this in data readout. Therefore, as almost similar to the invention in the first aspect, the offset voltage generated between the first and second bit lines is zero, correct information can be read out in semiconductor integrated circuit devices such as a DRAM using low voltage, and the numbers of the dummy word lines, the dummy cells, and the dummy word line drive circuits can be reduced, thus allowing reductions in the chip size and in the power consumption. Furthermore, since the voltage transitions of the first and second word lines are small, the dummy word line drive circuits have a fast operating speed and they are not adversely affected by noises. Moreover, since the drive performance of the dummy word line drive circuits is fine to be small, the amount of power consumption can be further reduced.

According to the invention in fourth and sixth aspects, since the dummy word line is changed from the first power supply potential level to the third power supply potential level in data readout, the aspects have almost the same advantages as those of the invention in the first aspect. In addition, the dummy word line is changed from the first power supply potential level as the precharge level to the third power supply potential level lower than this. The third power supply potential is applied to the semiconductor well forming the memory cell, for example, thus allowing the leakage current at the P-N junction in the semiconductor well to be reduced. Therefore, the amount of power consumption in the memory cell part can be further reduced.

What is claimed is:

1. A semiconductor integrated circuit device comprising:
   first and second bit lines,
   a word line intersecting the first and second bit lines,
   a dummy word line intersecting the first and second bit lines,
   a memory cell connected to an intersection of the bit lines and the word line,
   a dummy cell being connected to an intersection of the bit lines and the dummy word line,
   a dummy word line drive circuit connected to the dummy word line, the dummy word line drive circuit supplying a precharge potential level that is higher than a first power supply potential level and a second power supply potential level lower than the first power supply potential level to the dummy word line; and
   a word line drive circuit connected to the word line, the word line drive circuit supplying the second power supply potential level and the precharge potential level to the word line.

2. A semiconductor integrated circuit device according to claim 1, wherein the dummy word line drive circuit includes
   an NMOS transistor having a source connected to a second power supply potential source, a drain connected to the dummy word line and a gate connected to receive a dummy drive control signal; and
   a PMOS transistor having a source connected to a precharge potential source, a drain connected to the dummy word line and a gate connected to receive the dummy drive control signal.

3. A semiconductor integrated circuit device according to claim 2, wherein the NMOS transistor has a threshold voltage and wherein the precharge potential level is higher than a sum of the first power supply potential level and the threshold voltage.

4. A semiconductor integrated circuit device according to claim 1, wherein the word line drive circuit includes
   an NMOS transistor having a source connected to a second power supply potential source, a drain connected to the word line and a gate connected to receive a drive control signal; and
   a PMOS transistor having a source connected to a precharge potential source, a drain connected to the word line and a gate connected to receive the drive control signal.

5. A semiconductor integrated circuit device according to claim 4, wherein the NMOS transistor has a threshold voltage and wherein the precharge potential level is higher than a sum of the first power supply potential level and the threshold voltage.

6. A semiconductor integrated circuit device comprising:
   first and second bit lines,
   a word line intersecting the first and second bit lines,
   a dummy word line intersecting the first and second bit lines,
   a memory cell connected to an intersection of the bit lines and the word line,
   a dummy cell being connected to an intersection of the bit lines and the dummy word line,
   a dummy word line drive circuit connected to the dummy word line, the dummy word line drive circuit supplying a first power supply potential level, a precharge potential level that is higher than the first power supply potential level and a second power supply potential level lower than the first power supply potential level, to the dummy word line; and
   a word line drive circuit connected to the word line, the word line drive circuit supplying the second power supply potential level and the precharge potential level to the word line.

7. A semiconductor integrated circuit device according to claim 6, wherein the dummy word line drive circuit includes
   an NMOS transistor having a source connected to a second power supply potential source, a drain connected to the dummy word line and a gate connected to receive a first dummy drive control signal;
   a first PMOS transistor having a source, a drain connected to the dummy word line and a gate connected to receive the first dummy drive control signal;
   a second PMOS transistor having a source connected to a precharge potential source, a drain connected to the source of the first PMOS transistor and a gate connected to receive a second dummy drive control signal; and
   a third PMOS transistor having a source connected to a first power supply potential source, a drain connected to the source of the first PMOS transistor and a gate connected to receive a third dummy drive control signal.

8. A semiconductor integrated circuit device according to claim 7, wherein the NMOS transistor has a threshold voltage and wherein the precharge potential level is higher than a sum of the first power supply potential level and the threshold voltage.

9. A semiconductor integrated circuit device according to claim 6, wherein the dummy word line drive circuit includes
   a first NMOS transistor having a source connected to a second power supply potential source, a drain connected to the dummy word line and a gate connected to receive a first dummy drive control signal;
   a first PMOS transistor having a source connected to a precharge potential source, a drain connected to the dummy word line and a gate connected to receive the first dummy drive control signal;
   a second NMOS transistor having a source connected to the second power supply potential source, a drain connected to the dummy word line and a gate connected to receive a second dummy drive control signal; and
   a second PMOS transistor having a source connected to a first power supply potential source, a drain connected to the dummy word line and a gate connected to receive the second dummy drive control signal.

10. A semiconductor integrated circuit device according to claim 6, wherein the word line drive circuit includes an NMOS transistor having a source connected to a second power supply potential source, a drain connected to the word line and a gate connected to receive a drive control signal; and a PMOS transistor having a source connected to a precharge potential source, a drain connected to the word line and a gate connected to receive the drive control signal.

11. A semiconductor integrated circuit device according to claim 6, wherein the NMOS transistor has a threshold voltage and wherein the precharge potential level is higher than a sum of the first power supply potential level and the threshold voltage.

12. A semiconductor integrated circuit device comprising:
first and second bit lines,
a word line intersecting the first and second bit lines,
a dummy word line intersecting the first and second bit lines,
a memory cell connected to an intersection of the bit lines and the word line,
a dummy cell being connected to an intersection of the bit lines and the dummy word line,
a dummy word line drive circuit connected to the dummy word line, the dummy word line drive circuit supplying a first power supply potential level, a second power supply potential level that is lower than the first power supply potential level and a third power supply potential level that is lower than the second power supply potential level, to the dummy word line; and
a word line drive circuit connected to the word line, the word line drive circuit supplying the second power supply potential level and the precharge potential level to the word line.

13. A semiconductor integrated circuit device according to claim 12, wherein the dummy word line drive circuit includes
a PMOS transistor having a source connected to a first power supply potential source, a drain connected to the dummy word line and a gate connected to receive a first dummy drive control signal;

a first NMOS transistor having a source, a drain connected to the dummy word line and a gate connected to receive the first dummy drive control signal;

a second NMOS transistor having a source connected to a second power supply potential source, a drain connected to the source of the first NMOS transistor and a gate connected to receive a second dummy drive control signal; and a third NMOS transistor having a source connected to a third power supply potential source, a drain connected to the source of the first NMOS transistor and a gate connected to receive a third dummy drive control signal.

14. A semiconductor integrated circuit device according to claim 12, wherein the second power supply voltage level is a ground level.

15. A semiconductor integrated circuit device according to claim 12, wherein the word line drive circuit includes
an NMOS transistor having a source connected to a second power supply potential source, a drain connected to the word line and a gate connected to receive a drive control signal; and a PMOS transistor having a source connected to a precharge potential source, a drain connected to the word line and a gate connected to receive the drive control signal.

16. A semiconductor integrated circuit device according to claim 12, wherein the NMOS transistor has a threshold voltage and wherein the precharge potential level is higher than a sum of the first power supply potential level and the threshold voltage.

* * * * *